(12) United States Patent
Tagashira et al.

(10) Patent No.: US 10,431,731 B2
(45) Date of Patent: Oct. 1, 2019

(54) METHOD FOR FORMING PZT FERROELECTRIC FILM

(71) Applicants: JAPAN ADVANCED INSTITUTE OF SCIENCE AND TECHNOLOGY, Nomi (JP); MITSUBISHI MATERIALS CORPORATION, Tokyo (JP)

(72) Inventors: Yuki Tagashira, Nomi (JP); Reijiro Shimura, Nomi (JP); Yuzuru Takamura, Nomi (JP); Jinwang Li, Nomi (JP); Tatsuya Shimoda, Nomi (JP); Toshiaki Watanabe, Sanda (JP); Nobuyuki Soyama, Naka (JP)

(73) Assignees: JAPAN ADVANCED INSTITUTE OF SCIENCE AND TECHNOLOGY, Nomi-shi (JP); MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/755,282

(22) PCT Filed: Aug. 26, 2016

(86) PCT No.: PCT/JP2016/074959
§ 371 (c)(1),
(2) Date: Feb. 26, 2018

(87) PCT Pub. No.: WO2017/038676
PCT Pub. Date: Mar. 9, 2017

(65) Prior Publication Data
US 2018/0248109 A1     Aug. 30, 2018

(30) Foreign Application Priority Data

Aug. 28, 2015   (JP) ................................ 2015-168480
Aug. 26, 2016   (JP) ................................ 2016-165368

(51) Int. Cl.
H01L 41/43      (2013.01)
H01L 41/318     (2013.01)
(Continued)

(52) U.S. Cl.
CPC ........ *H01L 41/43* (2013.01); *H01L 27/11502* (2013.01); *H01L 27/11521* (2013.01);
(Continued)

(58) Field of Classification Search
None
See application file for complete search history.

(56) References Cited

U.S. PATENT DOCUMENTS 6,198,225 B1 *   3/2001   Kano ...................... G09G 3/22
                                                  315/169.3
6,730,522 B1 *   5/2004   Nakamura ............... C01G 1/02
                                                  257/E21.241
(Continued)

FOREIGN PATENT DOCUMENTS

JP      06-234551 A      8/1994
JP      2005-505911 A    2/2005
(Continued)

OTHER PUBLICATIONS

International Preliminary Report dated Mar. 6, 2018, issued for PCT/JP2016/074959 and English translation thereof.

*Primary Examiner* — Moazzam Hossain
*Assistant Examiner* — Stanetta D Isaac
(74) *Attorney, Agent, or Firm* — Locke Lord LLP (57) ABSTRACT

The present invention comprises: a step of applying a liquid composition for forming a PZT ferroelectric film; a step of drying the film applied with the liquid composition; a step of irradiating UV rays onto the dried film at a temperature of 150 to 200° C. in an oxygen-containing atmosphere; and after the application step, the drying step, and the UV
(Continued)

irradiation step once, or more times, a step of firing for crystallizing a precursor film of the UV-irradiated ferroelectric film by raising a temperature with a rate of 0.5° C./second or higher in an oxygen-containing atmosphere or by raising a temperature with a rate of 0.2° C./second or higher in a non-oxygen containing atmosphere, followed by keeping the temperature at 400 to 500° C. An amount of liquid composition is set such that thickness of the ferroelectric film be 150 nm or more for each application and ozone is supplied during UV irradiation.

6 Claims, 2 Drawing Sheets

(51) Int. Cl.
*H01L 27/11502* (2017.01)
*H01L 41/187* (2006.01)
*H01L 41/316* (2013.01)
*H01L 27/11521* (2017.01)

(52) U.S. Cl.
CPC ........ *H01L 41/1876* (2013.01); *H01L 41/316* (2013.01); *H01L 41/318* (2013.01)

(56) References Cited

U.S. PATENT DOCUMENTS

2013/0015391 A1* 1/2013 Lousada Silveirinha Vilarinho ............... B82Y 30/00 252/62.9 PZ
2014/0295197 A1 10/2014 Doi et al.

FOREIGN PATENT DOCUMENTS

| | | |
|---|---|---|
| JP | 2011-086819 A | 4/2011 |
| JP | 2014-192329 A | 10/2014 |
| WO | 02/073680 A2 | 9/2002 |

* cited by examiner

METHOD FOR FORMING PZT FERROELECTRIC FILM

TECHNICAL FIELD

The present invention relates to a method for forming a PZT ferroelectric film by CSD (Chemical Solution Deposition) method. More specifically, the present invention relates to a method for forming a PZT ferroelectric film having not only thickness of 150 nm or more without forming cracks after firing a liquid composition for forming a PZT ferroelectric film that is coated by one application (hereunder, this composition is sometimes referred to as simply "liquid composition") but also high crystallinity, thereby having excellent dielectric characteristics and piezoelectric characteristics. Meanwhile, the present international application claims a priority right on the basis of the Japanese Patent Application No. 168480 filed on Aug. 28, 2015 (Japanese Patent Application No. 2015-168480); and the entire content of Japanese Patent Application No. 2015-168480 is incorporated into the present international application.

BACKGROUND ART

Upon forming a PZT ferroelectric film having a perovskite structure by a gel-sol method typically represented by the CSD method, when a precursor film of a ferroelectric film which contains more Pb than the stoichiometric composition thereof is fired under a usual condition (for example, in an air atmosphere), a quasi-stable phase called a pyrochlore phase is formed. When this pyrochlore phase is remained, the PZT ferroelectric film having the perovskite structure cannot be obtained. For this reason, it has been known that in order to transform the pyrochlore phase to the perovskite phase, the firing has to be generally carried out at high temperature of 600 to 700° C.

In order to avoid this high-temperature firing, a method for producing a PZT film is disclosed wherein the method comprises a step of forming a precursor film by drying it at the temperature of 300° C. or lower after the liquid composition for forming the PZT ferroelectric film is applied to a substrate and a step of forming the perovskite phase by firing at low temperature in an oxidative atmosphere after a divalent lead ion ($Pb^{2+}$) in the precursor film is reduced to a zero-valent lead ($Pb^0$) so as to suppress formation of the pyrochlore phase (for example, see Patent Literature 1). This method is characterized by that the reduction is carried out by heating the substrate having the formed precursor film to 300 to 450° C. with the temperature rising rate of 5° C./minute or higher in a non-oxidative atmosphere, or the substrate having the formed precursor film is heated to 300 to 450° C. with the temperature rising rate of 5° C./second or higher in an oxidative atmosphere.

On the other hand, a method for forming the ferroelectric thin film is disclosed wherein after a sol-gel solution comprising a metal alkoxide and a solvent or a solution of a metal organic agent is applied to one surface of a supporting substrate, in an ozone-containing gas atmosphere UV rays are irradiated to a coat film comprising the sol-gel solution or the solution of a metal organic agent, and then, the supporting substrate is subject to a heat treatment, or UV rays are irradiated with simultaneous heat treatment of the supporting substrate (for example, see Patent Literature 2). In Patent Literature 2 in which production of a $(Ba_xSr_{1-x})TiO_3$ film is explained, it is described that the same effect can also be obtained even when this method is used in production of other ferroelectric thin films such as PZT film and the PLZT film. In addition, in Patent Literature 2, it is described that because unnecessary compounds in the coat film can be effectively removed by a photochemical reaction with ozone, which is generated by interaction of a free radical or an excited molecule liberated from the coat film by irradiation of UV rays with an oxygen and UV rays, the formation method of the ferroelectric thin film having less inhibitory factors for crystal growth in the heat treatment process thereby having excellent electric characteristics can be realized.

PRIOR ART LITERATURES

Patent Literatures

[Patent Literature 1] Japanese Patent Laid-Open Publication No. 2011-086819 (claim 1, claim 3, claim 4, and paragraph [0006])
[Patent Literature 2] Japanese Patent Laid-Open Publication No. H06-234551 (claim 4, claim 5, paragraph [0016], and paragraph [0018])

DISCLOSURE OF INVENTION

Problems to be Solved by the Invention

It is described in Patent Literature 1 that when firing is carried out at high temperature of 600 to 700° C., there is a problem that the substrate to form the precursor film thereon is limited to those endurable to the high-temperature firing, and when the PZT ferroelectric film is formed in an integrated circuit or the like of various electronic parts, there are problems that not only the high-temperature firing damages various devices and a metal wiring that constitutes the circuit but also an internal diffusion takes place between the PZT ferroelectric film and the substrate.

The production method of the PZT film described in Patent Literature 1 can solve these problems; however, because the reduction is carried out by heating the PZT precursor film at 300 to 450° C. after the temperature reaches this temperature at a predetermined temperature rising rate, if the amount of application in each application is increased, a stress caused by volume shrinkage which takes place with decomposition of organic substances in the liquid composition is not sufficiently relaxed, so that there has been a problem of formation of cracks after firing. Namely, with one application the liquid composition cannot form a thick film of 150 nm or more without causing cracks after firing; and thus, there has been a margin for further improvement.

In Patent Literature 2, it is described that the method described therein can also be used in formation of the PZT ferroelectric film; however, this method mainly aims to effectively remove unnecessary compounds in the coat film. Therefore, there is neither description about the pyrochlore phase inherent to the PZT ferroelectric body which is formed under usual condition, nor is clearly described the temperature condition during the UV irradiation as well as the condition of the heat treatment after or during the UV irradiation; and thus, it does not show the way how to form the PZT ferroelectric film having the perovskite structure without the pyrochlore phase.

The first object of the present invention is to provide a method for forming a PZT ferroelectric film having not only thickness of 150 nm or more without forming cracks after firing a liquid composition for forming a PZT ferroelectric film that is coated by one application but also high crystallinity, thereby having excellent dielectric characteristics and piezoelectric characteristics. The second object of the present invention is to provide a method for forming a PZT ferroelectric film having a lowered leakage current density of the ferroelectric film that is formed from the liquid composition by suppressing an excess amount of lead in the liquid composition.

Means for Solving the Problems

A first aspect of the present invention is a method for forming a PZT ferroelectric film, wherein the method comprises: a step of applying a liquid composition for forming a PZT ferroelectric film; a step of drying the film applied with the liquid composition; a step of irradiating UV rays onto the dried film at a temperature of 150 to 200° C. in an oxygen-containing atmosphere; and after the application step, the drying step, and the UV irradiation step once, or more times, a step of firing for crystallizing a precursor film of the UV-irradiated ferroelectric film by raising a temperature with a temperature rising rate of 0.5° C./second or higher in an oxygen-containing atmosphere or by raising a temperature with a temperature rising rate of 0.2° C./second or higher in a non-oxygen containing atmosphere, followed by keeping the temperature at 400 to 500° C.; and further, an amount of the liquid composition in each application is set such that thickness of the ferroelectric film be 150 nm or more for each application and ozone is supplied during the UV irradiation.

A second aspect of the present invention is the method for forming the PZT ferroelectric film based on the first aspect, wherein an atomic ratio of Pb, Zr, and Ti metals in the liquid composition is Pb:Zr:Ti=100 to 125:20 to 80:80 to 20.

A third aspect of the present invention is the method for forming the PZT ferroelectric film based on the first or the second aspect, wherein the liquid composition comprises a precursor of the PZT ferroelectric film, a solvent, and a reaction controlling substance which is polyvinyl pyrrolidone (PVP), polyacrylamide, or polyvinyl acetamide; and an amount of the reaction controlling substance relative to 1 mole of the precursor is in a range of 0.0025 to 0.25 mole.

Advantages

In the method for forming the PZT ferroelectric film according to the first aspect of the present invention, by irradiating UV rays to the dried film at the temperature of 150 to 200° C. in the oxygen-containing atmosphere, not only ozone is generated but also ozone is supplied further, so that organic substances decomposed by the ozone generated by the UV irradiation and the ozone supplied are converted to $H_2O$ and CO or $CO_2$; therefore, most of the organic substances in the liquid composition are decomposed. The film before decomposition of the organic substances (precursor film) is thicker than the film after the decomposition (oxide film), wherein the volume difference therebetween is usually 3 times or more, at least about 2 times. With decomposition of the organic substances, the precursor's volume shrinks. In the method of Patent Literature 1, during reduction the temperature is raised at a predetermined temperature rising rate followed by heating at a high temperature of 300 to 450° C., so that the organic substances decompose rapidly and crystallization takes place with rapid change of the volume and structure of the precursor film. Therefore, when the amount of application of the liquid composition in each application is set such that thickness of the ferroelectric film be 150 nm or more for each application, the stress during the volume shrinkage of the precursor film cannot be satisfactorily relaxed thereby causing the cracks when the precursor film is fired. On the other hand, according to the formation method of the first aspect, even if the thickness is set so as to be 150 nm or more, because the organic substances are decomposed at a low temperature of 150 to 200° C. by the ozone in the step of the UV irradiation, there is no rapid change of the volume and structure of the precursor film, and in addition, the organic substances can be satisfactorily decomposed by the ozone even at low temperature. Therefore, the stress can be satisfactorily relaxed during the volume shrinkage, so that there are no cracks formed when the precursor film is fired. Upon decomposition of the liquid composition, part of C (carbon) and H (hydrogen) remains as free radicals in the film. Because the divalent lead ion ($Pb^{2+}$) is converted to the zero-valent lead ($Pb^0$) due to reducing actions of these C (carbon) and H (hydrogen), and also because the temperature is not higher than 200° C., the pyrochlore phase cannot be formed in the film. Subsequent to this UV irradiation, by raising the temperature with the temperature rising rate of 0.5° C./second or higher in an oxygen-containing atmosphere or by raising the temperature with the temperature rising rate of 0.2° C./second or higher in a non-oxygen containing atmosphere, followed by keeping the temperature at 400 to 500° C., the precursor film of the ferroelectric film can be crystallized without passing through the pyrochlore phase and without forming the cracks, so that the PZT ferroelectric film having the perovskite structure with excellent dielectric characteristics and piezoelectric characteristics can be obtained.

In the method forming the PZT ferroelectric film according to the second aspect of the present invention, because the atomic ratio of Pb, Zr, and Ti metals in the liquid composition is Pb:Zr:Ti=100 to 125:20 to 80:80 to 20, the leakage current density of the ferroelectric film that is formed from this liquid composition can be suppressed to a low level.

In the method of forming the PZT ferroelectric film according to the third aspect of the present invention, because the liquid composition comprises, in addition to the precursor of the PZT ferroelectric film and the solvent, the reaction controlling substance, which is polyvinyl pyrrolidone (PVP), polyacrylamide, or polyvinyl acetamide, with the amount thereof relative to 1 mole of the precursor being in the range of 0.0025 to 0.25 mole, the stress relaxation accompanied with the volume shrinkage of the precursor PZT film during the UV irradiation can take place more surely; and thus, the cracks are not formed when the precursor film is fired.

BEST MODES FOR CARRYING OUT THE INVENTION

Next, the embodiments for carrying out the present invention will be explained.

[Liquid Composition for Forming the PZT Ferroelectric Film]

The liquid composition of the present invention is the liquid composition for forming the PZT ferroelectric film. The PZT ferroelectric film is a film of a composite metal oxide having a perovskite structure represented by a general formula of $Pb(Zr_xTi_{1-x})O_3$ (0<x<1). The liquid composition of the present invention is a sol-gel solution including a PZT precursor for forming the PZT ferroelectric film (PZT precursor solution). The atomic ratio of Pb, Zr, and Ti metals in the liquid composition is preferably Pb:Zr:Ti=100 to 125:20 to 80:80 to 20. When the ratio of Pb is less than 100, a non-perovskite phase is prone to be formed; on the other hand, when the ratio of Pb is more than 125, the leakage current density is prone to be increased. The atomic ratio of Pb:Zr:Ti=105 to 120:20 to 80:80 to 20 is more preferable.

The PZT precursor is a mixture that raw materials of each metal element of Pb, Zr, and Ti are mixed such that the each metal element may give the mass ratio to form the PZT ferroelectric film, wherein as the raw materials, metal compounds having an organic group bonded to the metal thereof via an oxygen atom or a nitrogen atom of the organic group are preferably used. For example, one, or two or more of compounds selected from the group composed of a metal alkoxide, a metal diol complex, a metal triol complex, a metal carboxylate salt, a metal β-diketonate complex, a metal β-diketo ester complex, a metal β-iminoketo complex, and a metal amino complex may be used. Especially preferable compounds are a metal alkoxide, a partial hydrolysate thereof, and an organic acid salt.

Raw materials of each Pb, Zr, and Ti metal element as well as a solvent are taken into a reaction vessel; and then, the resulting mixture is heated under reflux in an inert atmosphere to form the PZT precursor solution. The raw materials of each metal element are mixed so as to give the metal element ratio to form the PZT ferroelectric body.

Concentration of the PZT precursor in the liquid composition is, on the basis of the oxide-converted concentration, preferably in the range of 17 to 35% by mass, while more preferably in the range of 20 to 25% by mass. When the concentration is less than 17% by mass, a satisfactory film thickness cannot be obtained; on the other hand, when the concentration is more than 35% by mass, the cracks are prone to be formed.

The solvents that can be used are diols such as propylene glycol, ethylene glycol, and 1,3-propanediol. When the diol is used as the solvent, the storage stability of the liquid composition can be enhanced.

Illustrative example of the solvent other than the diol that can be used includes a carboxylic acid, an alcohol other than the diol, an ester, ketones (such as acetone and methyl ethyl ketone), ethers (such as dimethyl ether and diethyl ether), cycloalkanes (such as cyclohexane and cyclohexanol), aromatic compounds (such as benzene, toluene, and xylene), and tetrahydrofuran.

When the alcohol is used as the solvent for a dilution purpose, in view of applicability and drying properties of the liquid, a linear monoalcohol having a carbon chain of 1 to 4 carbons is preferable. In addition, in the use for making the film dense, it is preferable to use a linear monoalcohol having a carbon chain of 6 to 12 carbons together with the linear monoalcohol having a carbon chain of 1 to 4 carbons. By so doing, the gel film capable of effectively discharging the organic substances to outside the film during UV irradiation at the temperature of 150 to 200° C. can be formed, so that the dense PZT film having excellent characteristics can be obtained even if the coat film is made thick. When only the alcohol having the carbon chain with less than 6 carbons is used, the boiling point thereof is not so satisfactorily high that densification of the film is insufficient; on the other hand, when the carbons in the carbon chain is more than 12, the solubility thereof into the sol-gel solution is so low that it is difficult to dissolve the sufficient amount, and in addition, viscosity of the solution becomes so high that the solution cannot be applied uniformly.

The liquid composition of the present invention includes the solvent and the precursor of the PZT ferroelectric film. It is preferable that the liquid composition of the present invention include, in addition to the above-mentioned, polyvinyl pyrrolidone (PVP), polyacrylamide, or polyvinyl acetamide, as the reaction controlling substance. Meanwhile, the reaction controlling substance is the substance that controls the reaction to form the ferroelectric structure by incorporating oxygen during firing. The amount of this reaction controlling substance relative to 1 mole of the precursor is preferably in the range of 0.0025 to 0.25 mole, while more preferably in the range of 0.0025 to less than 0.2 mole. When the amount of the reaction controlling substance is smaller than the suitable amount, the stress inside the film cannot be satisfactorily relaxed, so that the cracks are prone to be formed. On the other hand, when the amount of the reaction controlling substance is more than the suitable amount, the dense thin film having high crystallinity cannot be obtained.

[Method for Forming the PZT Ferroelectric Film]

The method for forming the PZT ferroelectric film by using the liquid composition produced by the method described above will be explained. This formation method is the formation method of the ferroelectric film by the sol-gel method.

Firstly, the liquid composition is applied to a substrate so as to form the coat film having a predetermined thickness. The amount of the liquid composition in each application is set such that thickness of the ferroelectric film be in the range of 150 nm or more for each application. By so doing, the film thickness not causing the cracks after firing can be obtained with less number of the application. Here, "thickness" is the thickness of the ferroelectric film after firing; this matter will be mentioned later. The application method is not particularly restricted, while illustrative example thereof includes the spin coating method, the dip coating method, the LSMCD (Liquid Source Misted Chemical Deposition) method, and the static spray method. With regard to the substrate on which the ferroelectric film is formed, not to mention heat-resistant substrates such as a sapphire substrate and a silicon substrate formed with a lower electrode, the substrate such as a synthetic quartz substrate, a fused quartz substrate, and a non-alkaline glass may also be used. The lower electrode formed on the substrate has conductivity of Pt, $TiO_x$, Ir, Ru, and the like, and is formed of a material not reactive to the ferroelectric film. For example, the lower electrode may have a two-layer structure of a $TiO_x$ layer and a Pt layer in order from the substrate side. As the specific example of the $TiO_x$ layer, the $TiO_2$ layer may be mentioned. Furthermore, when a silicon substrate is used as the substrate, a $SiO_2$ film may be formed on surface of the substrate by thermal oxidation of this substrate.

Next, the liquid composition applied onto the substrate is dried at 80 to 250° C. for 5 to 30 minutes in an air atmosphere, in an oxygen gas atmosphere, or an atmosphere containing water vapor. By this drying, the solvent in the liquid composition evaporates; and with this, the metal compound forms a network in the film so that the liquid composition turns to a gel. It is to be noted that, especially in order to remove a low-boiling point solvent and the adsorbed water molecule, before drying a low-temperature heating (drying) at a temperature of 70 to 90° C. may be conducted for a period of about 0.5 to 5 minutes by using a hot plate or the like.

Next, UV rays are irradiated to the gelated dry film on the substrate in an oxygen-containing atmosphere for 5 to 15 minutes in the temperature range of 150 to 200° C., while preferably in the temperature range of 180 to 200° C. With regard to the oxygen-containing atmosphere, an air atmospheric or an oxygen gas atmosphere may be mentioned. When UV rays are irradiated in an oxygen-containing atmosphere, not only ozone is generated but also ozone is supplied; and thus, the organic substances decomposed by the ozone generated by the UV irradiation and the ozone supplied are converted to $H_2O$ and CO or $CO_2$, which are then liberated from the PZT precursor film. At this time, when the UV irradiation is carried out with the atmosphere temperature of lower than 150° C. for a period of shorter than 5 minutes, the organic substances in the liquid composition are difficult to be decomposed. On the other hand, when the temperature is higher than 200° C., the organic substances in the liquid composition are rapidly decomposed so that the stress relaxation during volume shrinkage of the precursor film is insufficient thereby easily forming the cracks when the precursor film is fired. As mentioned before, most of the organic substances in the liquid composition are decomposed by the UV irradiation, but part of C (carbon) and H (hydrogen) remains as free radicals in the film. Because the divalent lead ion ($Pb^{2+}$) in the liquid composition is converted to the zero-valent lead ($Pb^0$) due to reducing actions of these C (carbon) and H (hydrogen), and also because the temperature is not higher than 200° C., the pyrochlore phase cannot be formed in the film. In this way, the precursor film of the PZT ferroelectric film can be obtained.

Next, the precursor film of the PZT ferroelectric film obtained by the UV irradiation is fired. The firing is carried out by raising the temperature in an oxygen-containing atmosphere such as an air atmosphere or an oxygen gas atmosphere with the temperature rising rate of 0.5° C./second or higher, preferably in the range of 0.5 to 10° C./second, or by raising the temperature in a non-oxygen containing atmosphere with the temperature rising rate of 0.2° C./second or higher, preferably in the range of 0.2 to 10° C./second, followed by keeping the temperature at 400 to 500° C., preferably 420 to 450° C., for a period of 5 to 60 minutes in the same atmosphere as the atmosphere during the time of temperature raising. When the temperature is lower than 400° C. or the period is less than 5 minutes, the precursor does not crystallize; and when the temperature is higher than 500° C. or the period is more than 60 minutes, there occurs the problem that the metal wiring pattern melts or Pd evaporates to cause a change in composition. Under the firing conditions mentioned above, the precursor film can be fired without oxidizing the zero-valent lead ($Pb^0$) in the film nor passing through (not forming) the pyrochlore phase, so that the PZT ferroelectric film having the crystallized perovskite structure can be formed without forming cracks. The reason that the temperature is raised with the rate of 0.5° C./second or higher in the oxygen-containing atmosphere, or with the rate of 0.2° C./second or higher in the non-oxygen containing atmosphere is because formation of the pyrochlore phase can be avoided in this way. It is to be noted that the reason that the pyrochlore phase is not formed even if the temperature rising rate is 0.5° C./second, which is slower than 5° C./second or higher, the temperature rising rate in Patent Literature 1, is as follows. The outermost surface of the PZT precursor film is oxidized by the ozone to form the outer shell which keeps the reduction atmosphere inside the precursor film. Therefore, penetration of oxygen into the precursor film is difficult; and thus, even if the temperature rising rate is slow, the reduction atmosphere formed by the UV irradiation is kept so that the pyrochlore phase is not formed. Because the diffusion rate of oxygen is slowed by the thick film, the pyrochlore phase is not formed even if the temperature rising rate is slow.

Alternatively, from the step of application of the liquid composition to the step of UV irradiation may be repeated twice or more so as to obtain a predetermined thickness followed by firing at once in the end. When the liquid composition mentioned above is used and the UV irradiation is carried out with supplying the ozone in an oxygen atmosphere, because, among other things, the stress derived from the film shrinkage which takes place at the time of film formation can be suppressed, a thick film having the thickness of about 150 to 200 nm may be formed by each application without causing cracks. By repeating the application twice or more, the ferroelectric film having the film thickness of 300 nm or more, suitable for a PZT actuator, may be formed. In other words, a thick ferroelectric film having the thickness of, for example, 600 nm may be formed with a small repeating number.

By way of the steps mentioned above, the PZT ferroelectric film can be obtained. By using this PZT ferroelectric film, electronic parts such as a piezoelectric MEMS (Micro Electro Mechanical Systems), a ferroelectric memory, a ferroelectric a transistor, a capacitor, and a piezoelectric sensor may be manufactured.

EXAMPLES

Next, Examples of the present invention, together with Comparative Examples, will be explained in detail.

Example 1

After lead acetate trihydrate, titanium (iv) tetra-isopropoxide, zirconium (iv) tetra-butoxide, acetyl acetone, and propylene glycol each were weighed so as to give Pb:Zr:Ti=120:40:60 as the elemental ratio of Pb, Zr, and Ti metals in the PZT precursor, they were charged into a reaction vessel, and then heated under reflux in a nitrogen atmosphere at 150° C. for 1 hour. After heating under reflux, unreacted substances were removed by distillation under reduced pressure. After the solution having the unreacted substances removed was cooled to room temperature, water with the amount of 2 moles relative to 1 mole of the PZT precursor was added to the solution; and then, the resulting mixture was heated under reflux at 150° C. for 1 hour. Then, this was cooled to room temperature to obtain the PZT precursor solution (liquid composition). To this PZT precursor solution was added 0.025 mole (in terms of monomer, relative to 1 mole of the PZT precursor) of polyvinyl pyrrolidone (PVP) as the reaction controlling substance; and then, the resulting mixture was stirred at room temperature for 24 hours. After the stirring, ethanol, 1-butanol, and 1-octanol were added to dilute the PZT precursor solution so as to result in the concentration of 25% by mass in terms of the oxide in the solution. The solution thus diluted was dropped onto the Pt surface of the $Si/SiO_2/TiO_2/Pt$ substrate, and then spin-coated at 5000 rpm for 60 seconds so as to give 150 nm as the thickness of the ferroelectric film after firing.

Next, the film of the PZT precursor solution (liquid composition) applied onto the substrate was heated (dried) at low temperature of 80° C. for 3 minutes on a hot plate in an air atmosphere. Thereafter, the substrate is moved to a different hot plate, and then the coat film was dried at 250°

C. for 10 minutes in an air atmosphere. Next, the substrate was placed in an apparatus provided with an air-tight chamber and a low-pressure mercury lamps to irradiate UV rays of 184 nm and 254 nm as the light source (UV Ozone Cleaner model UV-300H-E, manufactured by Samco Inc.); and then, the substrate having the dried film was heated at 150° C. in an oxygen atmosphere. Under this condition, the dried and gelated film was irradiated with the UV rays for 10 minutes with charging the ozone into the air-tight chamber and discharging it therefrom at the flow rate of 3 to 10 sccm.

The application and drying of the precursor solution and the UV irradiation were repeated for 3 times. After completion of the third UV irradiation, the substrate was taken out from the air-tight chamber and cooled to room temperature. Thereafter, with flowing an air the precursor film on the substrate was heated with the temperature rising rate of 10° C./second in the RTA (Rapid Thermal Annealing) apparatus (model number of MILA-5000, manufactured by ULVAC-RIKO, Inc.); and when the temperature reached 450° C., this temperature was kept for 60 minutes for firing to obtain the PZT ferroelectric film.

Example 2

Except that at the time of the UV irradiation the substrate having the dried and gelated film was heated at 200° C., the procedure of Example 1 was repeated to obtain the PZT ferroelectric film.

Example 3

At the time of the UV irradiation the substrate having the dried and gelated film was heated at 200° C., and the temperature during firing was kept at 500° C. Except for these changes, the procedure of Example 1 was repeated to obtain the PZT ferroelectric film.

Example 4

At the time of the UV irradiation the substrate having the dried and gelated film was heated at 200° C., and the temperature rising rate during firing was set at 0.5° C./second. Except for these changes, the procedure of Example 1 was repeated to obtain the PZT ferroelectric film.

Example 5

At the time of the UV irradiation the substrate having the dried and gelated film was heated at 200° C., and the atmosphere during firing was made a nitrogen atmosphere, and the temperature rising rate was set at 0.2° C./second. Except for these changes, the procedure of Example 1 was repeated to obtain the PZT ferroelectric film.

Example 6

At the time of the UV irradiation the substrate having the dried and gelated film was heated at 200° C., and the temperature during firing was kept at 400° C. Except for these changes, the procedure of Example 1 was repeated to obtain the PZT ferroelectric film.

Comparative Example 1

Except that at the time of the UV irradiation the substrate having the dried and gelated film was heated at 140° C., the procedure of Example 1 was repeated to obtain the PZT ferroelectric film.

Comparative Example 2

Except that at the time of the UV irradiation the substrate having the dried and gelated film was heated at 250° C., the procedure of Example 1 was repeated to obtain the PZT ferroelectric film.

Comparative Example 3

At the time of the UV irradiation the substrate having the dried and gelated film was heated at 200° C., and the temperature rising rate during firing was set at 0.3° C./second. Except for these changes, the procedure of Example 1 was repeated to obtain the PZT ferroelectric film.

Comparative Example 4

At the time of the UV irradiation the substrate having the dried and gelated film was heated at 200° C., and the atmosphere during firing was made a nitrogen atmosphere, and the temperature rising rate during firing was set at 0.1° C./second. Except for these changes, the procedure of Example 1 was repeated to obtain the PZT ferroelectric film.

Comparative Example 5

At the time of the UV irradiation the substrate having the dried and gelated film was heated at 200° C., and the temperature during firing was kept at 300° C. Except for these changes, the procedure of Example 1 was repeated to obtain the PZT ferroelectric film.

Comparative Example 6

At the time of the UV irradiation, without supplying the ozone into the air-tight chamber, the substrate having the dried and gelated film was heated at 200° C. Except for these changes, the procedure of Example 1 was repeated to obtain the PZT ferroelectric film.

Comparative Example 7

Without irradiating the dried and gelated film with the UV rays, this dried film was fired. Except for this change, the procedure of Example 1 was repeated to obtain the PZT ferroelectric film.

The UV irradiation conditions and firing conditions until the PZT ferroelectric film is obtained in Examples 1 to 6 and Comparative Examples 1 to 7 are summarized in Table 1.

TABLE 1

| | UV irradiation condition | | Firing condition | | |
| --- | --- | --- | --- | --- | --- |
| | Temp. (° C.) | Ozone supply (yes/no) | Atmosphere | Temp. rising rate (° C./sec) | Kept temp. (° C.) |
| Example 1 | 150 | Yes | Air | 10 | 450 |
| Example 2 | 200 | Yes | Air | 10 | 450 |
| Example 3 | 200 | Yes | Air | 10 | 500 |
| Example 4 | 200 | Yes | Air | 0.5 | 450 |
| Example 5 | 200 | Yes | Nitrogen | 0.2 | 450 |
| Example 6 | 200 | Yes | Air | 10 | 400 |
| C. Example 1 | 140 | Yes | Air | 10 | 450 |
| C. Example 2 | 250 | Yes | Air | 10 | 450 |
| C. Example 3 | 200 | Yes | Air | 0.3 | 450 |
| C. Example 4 | 200 | Yes | Nitrogen | 0.1 | 450 |
| C. Example 5 | 200 | Yes | Air | 10 | 300 |

TABLE 1-continued

| | Thickness (nm) | | Crack (yes/no) | | Degree of crystallization |
|---|---|---|---|---|---|
| C. Example 6 | 200 | No | Air | 10 | 450 |
| C. Example 7 | No UV irradiation | | Air | 10 | 450 |

| | PZT ferroelectric film | | |
|---|---|---|---|
| | Thickness (nm) | Crack (yes/no) | Degree of crystallization |
| Example 1 | 450 | No | Excellent |
| Example 2 | 450 | No | Excellent |
| Example 3 | 450 | No | Excellent |
| Example 4 | 450 | No | Excellent |
| Example 5 | 450 | No | Excellent |
| Example 6 | 450 | No | Excellent |
| C. Example 1 | 450 | Yes | Not good |
| C. Example 2 | 450 | Yes | Not good |
| C. Example 3 | 450 | No | Not good |
| C. Example 4 | 450 | No | Not good |
| C. Example 5 | 450 | No | Not good |
| C. Example 6 | 450 | Yes | Not good |
| C. Example 7 | 450 | Yes | Not good |

Comparative Evaluation: Part 1

Figure 2:
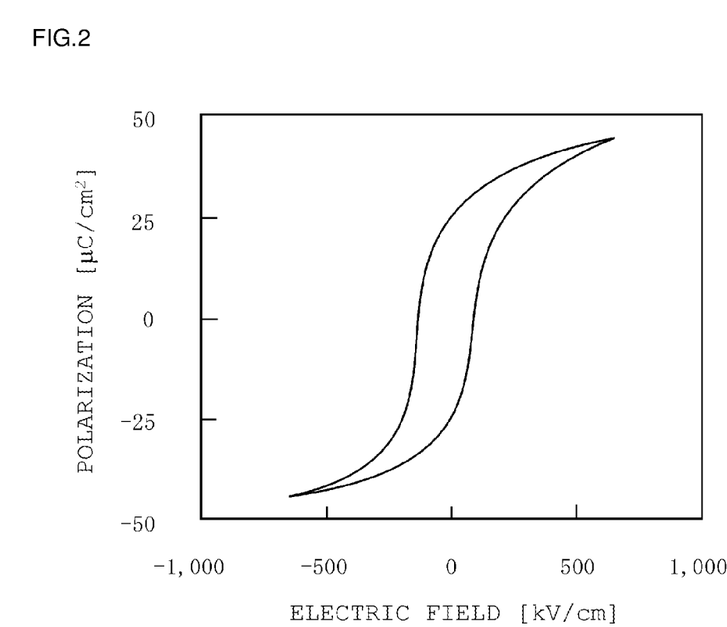
FIG. 2 is the electric field-polarization hysteresis curve of the PZT ferroelectric film obtained in Example 2.

The PZT ferroelectric films obtained in Examples 1 to 6 and Comparative Examples 1 to 7 were evaluated with regard to the film thickness, formation of cracks (yes/no), degree of crystallization, and dielectric property by the methods described below. The dielectric property result is shown in FIG. 2, and the rest results are summarized in Table 1.

[Evaluation Methods: Part 1]

(1) Film Thickness:

Film thickness (total thickness) of the ferroelectric film was measured with the wet etching method using hydrofluoric acid and with a contact-type thickness meter (Alpha-Step 500, manufactured by KLA-Tencor Ltd.).

(2) Formation of Cracks (Yes/No):

The tissues of the film surface and the cross section of the film were observed with a digital camera DP 25 of an optical microscope (BX51, manufactured by Olympus Corp.), and from the picture with magnification of 200, formation of cracks (yes/no) was observed. And, the condition not observing the cracks was judged to be "No" and the condition observing the cracks was judged to be "Yes".

(3) Degree of Crystallization:

Degree of crystallization was evaluated by measurement using the X-ray diffractometer (X'Pert PRO MRD Epi, manufactured by PANalytical B. V.). When the peak strength near $2\theta=38$ degree, corresponding to the PZT perovskite phase (111), was clear, degree of crystallization was judged to be "Excellent", when the peak could be distinctively seen, degree of crystallization was judged to be "Good", and when the peak was not confirmed, degree of crystallization was judged to be "Not good".

(4) Dielectric Property:

After an Au layer was formed on the ferroelectric film by a vapor-deposition method, the film was heated in an air atmosphere at 450° C. for 10 minutes to obtain a capacitor (ferroelectric element). The hysteresis characteristic of the capacitor thus obtained was studied.

[Evaluation Results: Part 1]

(1) With Regard to the Film Thickness:

As it is clear from Table 1, the film thicknesses of all the ferroelectric films of Examples 1 to 6 and Comparative Examples 1 to 7 were 450 nm.

(2) With Regard to the Cracks:

As it is clear from Table 1, the cracks were formed in the ferroelectric film in Comparative Example 1 in which the temperature during the UV irradiation was 140° C., in Comparative Example 2 in which the temperature during the UV irradiation was 250° C., in Comparative Example 6 in which the ozone was not supplied during the UV irradiation, and in Comparative Example 7 in which the UV irradiation was not carried out. The cracks were not formed in the ferroelectric film in the rest of Examples and Comparative Examples, i.e., Examples 1 to 8 and Comparative Examples 3 to 5.

Figure 1:
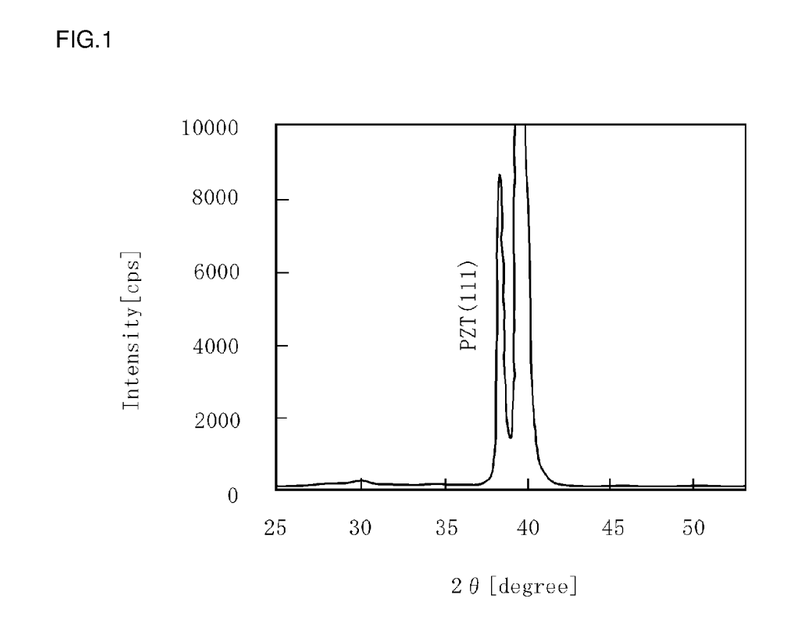
FIG. 1 is the X-ray diffraction chart of the PZT ferroelectric film obtained in Example 2.

(3) With Regard to Degree of Crystallization:

As it is clear from Table 1, all the ferroelectric films of Comparative Examples 1 to 7 were "Not good" in degree of crystallization. On the contrary, all the ferroelectric films of Examples 1 to 6 were "Excellent" in degree of crystallization. As it is clear from FIG. 1, crystallinity of the ferroelectric film of Example 2 was "Excellent" because the peak strength at $29=38$ degree was clear.

(4) With Regard to the Dielectric Property

The hysteresis characteristic of the capacitor obtained by using the ferroelectric film of Example 2 was studied. As it is clear from FIG. 2, the hysteresis shape of rectangular was confirmed, indicating that this is the capacitor having excellent dielectric property. The same were true for Example 1 and Examples 3 to 6.

Next, Examples 7 to 16 are shown below in which the elemental ratio of each metal of Pb, Zr, and Ti in the PZT precursor was changed.

Example 7

Except that each metal of Pb, Zr, and Ti was weighed so as to give Pb:Zr:Ti=95:40:60 as the metal elemental ratio in the PZT precursor, the procedure of Example 1 was repeated to obtain the PZT ferroelectric film.

Example 8

Except that each metal of Pb, Zr, and Ti was weighed so as to give Pb:Zr:Ti=100:40:60 as the metal elemental ratio in the PZT precursor, the procedure of Example 1 was repeated to obtain the PZT ferroelectric film.

Example 9

Except that each metal of Pb, Zr, and Ti was weighed so as to give Pb:Zr:Ti=105:40:60 as the metal elemental ratio in the PZT precursor, the procedure of Example 1 was repeated to obtain the PZT ferroelectric film.

Example 10

Except that each metal of Pb, Zr, and Ti was weighed so as to give Pb:Zr:Ti=110:40:60 as the metal elemental ratio in the PZT precursor, the procedure of Example 1 was repeated to obtain the PZT ferroelectric film.

Example 11

Except that each metal of Pb, Zr, and Ti was weighed so as to give Pb:Zr:Ti=115:40:60 as the metal elemental ratio in the PZT precursor, the procedure of Example 1 was repeated to obtain the PZT ferroelectric film.

Example 12

Except that each metal of Pb, Zr, and Ti was weighed so as to give Pb:Zr:Ti=125:40:60 as the metal elemental ratio in the PZT precursor, the procedure of Example 1 was repeated to obtain the PZT ferroelectric film.

Example 13

Except that each metal of Pb, Zr, and Ti was weighed so as to give Pb:Zr:Ti=130:40:60 as the metal elemental ratio in the PZT precursor, the procedure of Example 1 was repeated to obtain the PZT ferroelectric film.

Example 14

Except that each metal of Pb, Zr, and Ti was weighed so as to give Pb:Zr:Ti=105:20:80 as the metal elemental ratio in the PZT precursor, the procedure of Example 1 was repeated to obtain the PZT ferroelectric film.

Example 15

Except that each metal of Pb, Zr, and Ti was weighed so as to give Pb:Zr:Ti=105:52:48 as the metal elemental ratio in the PZT precursor, the procedure of Example 1 was repeated to obtain the PZT ferroelectric film.

Example 16

Except that each metal of Pb, Zr, and Ti was weighed so as to give Pb:Zr:Ti=105:80:20 as the metal elemental ratio in the PZT precursor, the procedure of Example 1 was repeated to obtain the PZT ferroelectric film.
<Comparative Evaluation: Part 2>

The PZT ferroelectric film each obtained in Example 1 and Examples 7 to 16 was evaluated by the methods described below with regard to the leakage current density, the peak clarity of the PZT perovskite phase (111), and the presence or absence of the phase different from the perovskite phase. These results together with the elemental ratio of each metal of Pb, Zr, and Ti in the PZT precursor are summarized in Table 2.

TABLE 2

| | Pb:Zr:Ti (metal element ratio) | Leakage current density (A·cm$^{-2}$) | Clarity of PZT (111) peak | Presence of phase different from perovskite phase (yes/no) |
|---|---|---|---|---|
| Example 1 | 120:40:60 | $8.3 \times 10^{-7}$ | Excellent | No |
| Example 7 | 95:40:60 | $1.7 \times 10^{-7}$ | Excellent | Slightly present |
| Example 8 | 100:40:60 | $1.2 \times 10^{-7}$ | Excellent | No |
| Example 9 | 105:40:60 | $4.4 \times 10^{-8}$ | Excellent | No |
| Example 10 | 110:40:60 | $5.6 \times 10^{-7}$ | Excellent | No |
| Example 11 | 115:40:60 | $7.4 \times 10^{-7}$ | Excellent | No |
| Example 12 | 125:40:60 | $8.1 \times 10^{-6}$ | Excellent | No |
| Example 13 | 130:40:60 | $1.2 \times 10^{-5}$ | Excellent | No |
| Example 14 | 105:20:80 | $5.2 \times 10^{-7}$ | Excellent | No |
| Example 15 | 105:52:48 | $2.1 \times 10^{-7}$ | Excellent | No |
| Example 16 | 105:80:20 | $1.8 \times 10^{-7}$ | Excellent | No |

[Evaluation Methods: Part 2]
(5) Leakage Current Density:

After an electrode with 200 μmφ was formed by the spattering method on surface of the obtained ferroelectric thin film, it was subjected to the damage recovery annealing by using RTA in an oxygen atmosphere at 450° C. for 1 minute to obtain a thin film condenser as the test sample. Then, the leakage current density was measured by applying the DC voltage of 5 V to this sample.

(6) Clarity of the PZT Peak (111):
This was evaluated in the same way as that for (3) evaluation of degree of crystallization as mentioned before.
(7) Presence or Absence of the Phase Different from the Perovskite Phase:
This was evaluated on the basis of presence or absence of the PZT pyrochlore phase by using the X-ray diffractometer mentioned before.
[Evaluation Results: Part 2]

As it is clear from Table 2, all the peaks of the PZT perovskite phase (111) of the PZT ferroelectric films obtained in Example 1 and Examples 7 to 16 were clear, and thus, they were all "Excellent". On the other hand, in Example 7 in which the ratio of Pb was 95, the peak of the PZT perovskite phase (111) was clear, but the phase different from the perovskite phase (non-perovskite phase) was slightly formed. Also, in Example 13 in which the ratio of Pb was 130, the result that the leakage current density was increased to $1.2 \times 10^{-5}$ A·cm$^{-2}$ was obtained.

INDUSTRIAL APPLICABILITY

The PZT ferroelectric film of the present invention can be used in the electronic parts such as a piezoelectric MEMS (Micro Electro Mechanical Systems), a ferroelectric memory, a ferroelectric transistor, a capacitor, and a piezoelectric sensor.

The invention claimed is:
1. A method for forming a PZT ferroelectric film, wherein the method comprises:
a step of applying a liquid composition for forming a PZT ferroelectric film;
a step of drying the film applied with the liquid composition;
a step of irradiating UV rays onto the dried film at a temperature of 150 to 200° C. in an oxygen-containing atmosphere; and
after the application step, the drying step, and the UV irradiation step once, or more times, a step of firing for crystallizing a precursor film of the UV-irradiated ferroelectric film by raising a temperature with a temperature rising rate of 0.5° C./second or higher in an oxygen-containing atmosphere or by raising a temperature with a temperature rising rate of 0.2° C./second or higher in a non-oxygen containing atmosphere, followed by keeping the temperature at 400 to 500° C.; and further,
an amount of the liquid composition in each application is set such that thickness of the ferroelectric film be 150 nm or more for each application and ozone is supplied during the UV irradiation.
2. The method for forming the PZT ferroelectric film according to claim 1, wherein an atomic ratio of Pb, Zr, and Ti metals in the liquid composition is Pb:Zr:Ti=100 to 125:20 to 80:80 to 20.
3. The method for forming the PZT ferroelectric film according to claim 1, wherein the liquid composition comprises a precursor of the PZT ferroelectric film, a solvent, and a reaction controlling substance which is polyvinyl pyrrolidone (PVP), polyacrylamide, or polyvinyl acetamide; and an amount of the reaction controlling substance relative to 1 mole of the precursor is in a range of 0.0025 to 0.25 mole.
4. The method for forming the PZT ferroelectric film according to claim 2, wherein the liquid composition comprises a precursor of the PZT ferroelectric film, a solvent, and a reaction controlling substance which is polyvinyl pyrrolidone (PVP), polyacrylamide, or polyvinyl acetamide; and an amount of the reaction controlling substance relative to 1 mole of the precursor is in a range of 0.0025 to 0.25 mole.

5. The method for forming the PZT ferroelectric film according to claim 1, wherein the step of firing for crystallizing a precursor film of the UV-irradiated ferroelectric film is carried out by raising a temperature with a temperature rising rate of 0.5° C./second or higher in an oxygen-containing atmosphere or by raising a temperature with a temperature rising rate of 0.2° C./second or higher in a non-oxygen containing atmosphere, followed by keeping the temperature at 420 to 500° C.

6. The method for forming the PZT ferroelectric film according to claim 1, wherein the step of firing for crystallizing a precursor film of the UV-irradiated ferroelectric film is carried out by raising a temperature with a temperature rising rate of 0.5 to 10° C./second or higher in an oxygen-containing atmosphere or by raising a temperature with a temperature rising rate of 0.2 to 10° C./second or higher in a non-oxygen containing atmosphere, followed by keeping the temperature at 400 to 500° C.

* * * * *